US008662309B2

(12) United States Patent
Kudose

(10) Patent No.: US 8,662,309 B2
(45) Date of Patent: Mar. 4, 2014

(54) METHOD FOR PACKING TAB TAPE, AND PACKING STRUCTURE FOR TAB TAPE

(75) Inventor: Satoru Kudose, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 289 days.

(21) Appl. No.: 12/737,861

(22) PCT Filed: Aug. 18, 2009

(86) PCT No.: PCT/JP2009/064454
§ 371 (c)(1),
(2), (4) Date: Feb. 24, 2011

(87) PCT Pub. No.: WO2010/024155
PCT Pub. Date: Mar. 4, 2010

(65) Prior Publication Data
US 2011/0147262 A1    Jun. 23, 2011

(30) Foreign Application Priority Data

Aug. 28, 2008    (JP) ................. 2008-220245

(51) Int. Cl.
*B65D 73/02*    (2006.01)
*B65D 81/20*    (2006.01)

(52) U.S. Cl.
USPC ........... 206/713; 206/524.8; 206/717; 53/432

(58) Field of Classification Search
USPC .............. 206/389, 398, 400, 524.8, 713, 717, 206/714; 53/411, 432, 434, 467; 242/520, 242/547, 600, 610.4, 610.6, 613.5; 257/678, 682
See application file for complete search history.

(56) References Cited

U.S. PATENT DOCUMENTS

| | | | | |
|---|---|---|---|---|
| 4,886,162 A | * | 12/1989 | Ambrogio | 206/524.8 |
| 5,086,919 A | | 2/1992 | Toral et al. | |
| 5,136,827 A | * | 8/1992 | Sawaya | 206/714 |
| 5,234,105 A | * | 8/1993 | Sato et al. | 206/524.8 |
| 5,494,168 A | * | 2/1996 | Hart | 206/714 |

(Continued)

FOREIGN PATENT DOCUMENTS

| | | |
|---|---|---|
| JP | U61-105929 | 7/1986 |
| JP | 3-71637 | 7/1991 |

(Continued)

OTHER PUBLICATIONS

International Search Report dated Oct. 6, 2009.

*Primary Examiner* — Luan K Bui
(74) *Attorney, Agent, or Firm* — Harness, Dickey & Pierce, P.L.C.

(57) ABSTRACT

A method of at least one embodiment of the present invention for packing a TAB tape is a method in which the TAB tape is wound on a core reel so as to be packed, the TAB tape being a tape-shaped insulating film on which circuits are provided in a repeated manner, the circuits each of which is made up of metal wiring and a solder resist. In at least one embodiment, the method includes a first step of winding at least the TAB tape on an outer peripheral surface of a core reel having a cylindrical shape, the core reel having a shaft hole on its inner peripheral side. This makes it possible to provide (i) a method for packing a TAB tape which method makes it possible to reduce a packing size, and (ii) a smaller packing structure for a TAB tape.

24 Claims, 5 Drawing Sheets

(56) References Cited

U.S. PATENT DOCUMENTS

| | | | |
|---|---|---|---|
| 5,601,243 A * | 2/1997 | Inagaki | 206/713 |
| 6,045,086 A | 4/2000 | Jeans | |
| 6,206,198 B1 * | 3/2001 | Troxtell et al. | 206/389 |
| 6,451,623 B1 * | 9/2002 | Kawada | 438/106 |
| 6,602,305 B2 * | 8/2003 | Kawada | 29/25.01 |
| 6,887,330 B2 * | 5/2005 | Onoshiro et al. | 242/554.1 |
| 7,582,968 B2 * | 9/2009 | Shimoishizaka et al. | 257/738 |
| 2002/0074440 A1 * | 6/2002 | Kiso | 242/345 |
| 2005/0016897 A1 | 1/2005 | Cho et al. | |
| 2006/0076454 A1 * | 4/2006 | Kawada | 242/600 |
| 2006/0091548 A1 | 5/2006 | Naiki et al. | |
| 2007/0042532 A1 | 2/2007 | Tsai et al. | |
| 2007/0120235 A1 | 5/2007 | Shimoishizaka et al. | |
| 2007/0255030 A1 | 11/2007 | Sakamoto et al. | |
| 2008/0006734 A1 * | 1/2008 | Tejima et al. | 242/610.4 |
| 2008/0184556 A1 | 8/2008 | Cho et al. | |

FOREIGN PATENT DOCUMENTS

| | | |
|---|---|---|
| JP | 3-176394 | 7/1991 |
| JP | 2000-113539 | 4/2000 |
| JP | 2003-231503 | 8/2003 |
| JP | 2004-075385 | 3/2004 |
| JP | 2004-090966 | 3/2004 |
| JP | 2004-319852 | 11/2004 |
| JP | 2005-045233 | 2/2005 |
| JP | 2005-093925 | 4/2005 |
| JP | 2005-217019 | 8/2005 |
| JP | 2007-150089 | 6/2007 |
| JP | 2007-326585 | 12/2007 |
| TW | 200624496 | 7/2006 |
| TW | 200708446 | 3/2007 |
| TW | I291754 | 12/2007 |

\* cited by examiner

FIG. 7

Conventional

| | Product Length | Total Product Length |
|---|---|---|
| 1 Lot | 40m | 40m |
| With Or Without Flat Spacer | | Yes |

Present Embodiment

| | Product Length | Total Product Length |
|---|---|---|
| 4 Lots | 40m | 160m |
| 2 Lots | 80m | 160m |
| 1 Lot | 160m | 160m |
| With Or Without Flat Spacer | | No |

Windable Maximal Value

| | Product Length | Total Product Length |
|---|---|---|
| 6 Lots | 40m | 240m |
| 3 Lots | 80m | 240m |
| 2 Lots | 120m | 240m |
| With Or Without Flat Spacer | | No |

BACKGROUND ART

METHOD FOR PACKING TAB TAPE, AND PACKING STRUCTURE FOR TAB TAPE

TECHNICAL FIELD

The present invention relates to a method for packing a TAB tape and a packing structure for a TAB tape which are for storing, shipping, and transporting a TAB tape wound on a reel on which TAB tape a wiring pattern and a solder-resist have been formed but no chip part has been mounted yet.

BACKGROUND ART

A TAB (Tape Automated Bonding) tape, a COF (Chip on Film) tape, etc. which are film-mounting semiconductor devices have been heretofore often wound on a reel. For example, in a manufacturing process, a chip part such as a semiconductor chip is mounted, by a reel to reel method, on a TAB tape on which a wiring pattern has been formed. Further, a TAB tape is wound on a reel while being stored or transported.

FIG. 8 is a view illustrating a conventional case in which a TAB tape 502 is wound on a reel 501.

As illustrated in FIG. 8, the TAB tape 502 is wound on the reel 501 so that the TAB tape 502 and an embossed spacer 503 overlap each other. Usually, the TAB tape 502 corresponding to 1 (one) lot is wound on one reel (e.g., the TAB tape 502 corresponding to 1 (one) lot (40 m) and 52 m of the embossed spacer 503 are wound on the reel 501 having an outer dimension of Ø405 mm). The reel 501 is arranged so as to wind in, between two flanges on both sides of the reel 501, the TAB tape 502 and the embossed spacer 503.

The structure allows the embossed spacer 503 subjected to embossing to serve as a buffer material. Thus, the embossed spacer 503 protects a circuit side of the TAB tape 502 wound on the reel 501 on which circuit side the wiring pattern is provided.

As disclosed in, e.g., Patent Literature 1, a TAB tape thus wound on a reel is sealed in a packing bag so as to be stored or transported.

There proposed various shapes of a reel for a TAB tape.

For example, a used reel is collected and cleaned in a cleaning process so as to be reused. In view of this, Patent Literature 2 discloses such a tape reel that its core portion which has been heretofore likely to accumulate a cleaning solution therein due to its sealed structure is formed into a skeletal one in order that improvement of a cleaning efficiency and a drying efficiency in the cleaning process improves reusability.

In order to prevent deformation of a TAB tape wound on a reel, it is necessary to wind a TAB tape on a reel, without causing a displacement. In view of this, Patent Literature 3 discloses a reel for a TAB tape which reel has holding plates each of which is attached to a corresponding one of respective outer surfaces of flange sections of the reel. A protrusion of each of the holding plates is inserted into a hole of a corresponding one of the flange sections so as to protrude from an inner surface of the corresponding one of the flange sections. This makes it possible to wind a TAB tape on the reel substantially narrowly in a width direction of the TAB tape. As a result, it becomes possible to wind the TAB tape on the reel so as to make edges of the TAB tape aligned.

CITATION LIST

Patent Literature 1
Japanese Patent Application Publication, Tokukai, No. 2004-90966 A (Publication Date: Mar. 25, 2004)

Patent Literature 2
Japanese Patent Application Publication, Tokukai, No. 2004-75385 A (Publication Date: Mar. 11, 2004)

Patent Literature 3
Japanese Patent Application Publication, Tokukai, No. 2005-93925 A (Publication Date: Apr. 7, 2005)

SUMMARY OF INVENTION

Technical Problem

Recently, there is an increasing demand for a reduction in size of a reel for a TAB tape. That is, reel sizes are generally increasing in accordance with a recent demand for longer TAB tapes. A large reel causes an increase in necessary storage space, and a decrease in productivity per floor area. In addition, a large reel has a large shipping form. Therefore, its volume is large. This increases a transportation cost.

The reels disclosed in Patent Literatures 1 to 3 have a problem in that the reels do not make it possible to reduce a reel size but only cause an increase in reel size due to an increase in length of a TAB tape.

Environmentally, it is desirable to reuse reels. However, a reuse cost is actually higher than a manufacturing cost. Further, it is necessary to prevent deformation (warpage) of flanges of a reel so as to prevent a displacement of a TAB tape due to winding. Therefore, reels must be handled under sufficient conditions for the prevention. This leads to high costs of the reels.

Further, a main material for reels is usually polystyrene (PS) or acrylonitrile butadiene styrene (ABS), from viewpoints of cost and molding workability. However, PS and ABS are hard, brittle, and easily grinded. Therefore, PS and ABS easily generate dust due to causes such as vibrations in transportation. Therefore, dust and a foreign substance adhere to a TAB tape. This can lead to failures such as leakage in mounting of chips.

The present invention was made in view of the conventional problems. An object of the present invention is to provide (i) a method for packing a TAB tape which method makes it possible to reduce a packing size, and (ii) a smaller packing structure for a TAB tape.

Solution to Problem

In order to attain the object, a method of the present invention for packing a TAB tape in which method the TAB tape is wound on a reel so as to be packed, the TAB tape being a tape-shaped insulating film on which circuits are provided in a repeated manner, the circuits each of which is made up of metal wiring and a solder resist, the method includes a first step of winding at least the TAB tape on an outer peripheral surface of a reel having a cylindrical shape, the reel having a shaft hole on its inner peripheral side.

Further, in order to attain the object, a packing structure of the present invention for a TAB tape in which packing structure the TAB tape is wound on a reel so as to be packed, the TAB tape being a tape-shaped insulating film on which circuits are provided in a repeated manner, the circuits each of which is made up of metal wiring and a solder resist, the packing structure includes: a reel having a cylindrical shape, and having a shaft hole on its inner peripheral side; and at least the TAB tape wound on an outer peripheral surface of the reel.

A conventional reel for a TAB tape has flanges having a width larger than a wound width of a TAB tape and an embossed spacer tape which are wound on the reel. As a result, a packing size is determined depending on a reel.

In contrast, according to the aforementioned arrangements of the present invention, the TAB tape and, if necessary, a spacer tape etc. are wound on the outer peripheral surface of the cylindrical reel. Therefore, a packing size after winding is determined by a wound width of the tape(s). Thus, a packing size according to the method of the present invention for packing a TAB tape or according to the packing structure of the present invention for a TAB tape is smaller than a packing size in the case of a conventional reel with flanges, for the reason that no flange is used in the present invention.

Further, the method of the present invention is preferably arranged such that in the first step, a tension from 0.5 N to 2 N is applied to the TAB tape so that stacked portions of the TAB tape thus wound have a close contact with each other.

Further, the packing structure of the present invention is preferably arranged such that stacked portions of the TAB tape thus wound on the reel have a close contact with each other.

According to the arrangements, only the TAB tape is wound on the outer peripheral surface of the reel. Therefore, no spacer tape is used which has been conventionally used. This makes it possible to further reduce a packing size, and reduce material costs.

Further, according to the method, the tension from 0.5 N to 2 N is applied to the TAB tape while the TAB tape is thus wound. This makes it possible to wind the TAB tape, without causing any problem.

Further, the method of the present invention is preferably arranged such that the reel has a Rockwell hardness of not less than M90 and a melt flow rate (g/10 min) of not less than 7. Further, the packing structure of the present invention is preferably arranged such that the reel has a Rockwell hardness of not less than M90 and a melt flow rate (g/10 min) of not less than 7. According to the arrangement, the reel has a high hardness and a high viscosity. This makes it possible to prevent dust generation.

Further, the method and the packing structure of the present invention are preferably arranged such that the reel has a surface resistance of not higher than $10^{11}\Omega$. This makes it possible to prevent leakage even if a generated foreign substance adheres to metal wiring of the TAB tape.

According to the present invention, only the TAB tape is wound on the reel so that a packing size is further reduced. Thus, the present invention makes it possible to wind, on the reel, more lots of the TAB tapes, as compared to a conventional case. Therefore, the method of the present invention is preferably arranged such that: 1 (one) lot of the TAB tape has a predetermined length; and a plurality of lots of TAB tapes are wound on the reel. Further, the packing structure of the present invention is preferably arranged such that: 1 (one) lot of the TAB tape has a predetermined length; and a plurality of lots of TAB tapes are wound on the reel.

Further, The method and the packing structure of the present invention are preferably arranged such that a tape is attached to any two adjacent ones of the plurality of lots of the TAB tapes, on one side of the plurality of lots of the TAB tapes, so that any two adjacent ones of the plurality of lots of the TAB tapes are joined to each other. This makes it possible to easily detach the tape in exchange of lots. This brings about a good workability.

Further, the method of the present invention preferably further includes a second step of vacuum-sealing, in an antistatic bag, the reel on which the TAB tape is wound. Further, the packing structure of the present invention is preferably arranged such that the reel on which the TAB tape is wound is vacuum-sealed in an antistatic bag.

Further, the method of the present invention preferably further includes a second step of vacuum-sealing, in an antistatic bag, the reel on which the plurality of lots of the TAB tapes are wound. Further, the packing structure of the present invention is preferably arranged such that the reel on which the plurality of lots of the TAB tapes are wound is vacuum-sealed in an antistatic bag.

According to the arrangements, such vacuum sealing makes it possible to fix the TAB tape so that the TAB tape is not displaced due to vibrations in transportation. Further, the arrangements make it possible to suppress oxidation of the metal wiring provided on the TAB tape.

Further, for more effective suppression of oxidation of the metal wiring, the packing structure of the present invention is preferably arranged such that nitrogen is sealed in the antistatic bag in which the reel on which the TAB tape is wound is vacuum-sealed.

In a case where silica gel is putted in the antistatic bag, excessive dryness causes a decrease in cumulative dimension of IL (inner leads). For this reason, it is necessary that the TAB tape be taken out from the antistatic bag, and then left standing for 24 hours, in order that ILB (Inner Lead Bonding) is carried out. Therefore, silica gel is not putted in the antistatic bag, in view of stabilization of the cumulative dimension of IL of the TAB tape and improvement of a working efficiency in ILB.

Further, the method of the present invention preferably further includes a third step of affixing, onto the antistatic bag, a label showing an order in which the plurality of lots of the TAB tapes are wound on the reel. Further, the packing structure of the present invention is preferably arranged such that a label showing an order in which the plurality of lots of the TAB tapes are wound on the reel is affixed onto the antistatic bag. This makes it possible to recognize quickly and easily the order of the lots of the TAB tapes being packed.

In general, a solder resist has a property such that its adhesion is increased by a temperature increase. In a case where the TAB tapes are stored, shipped, and/or transported under high temperature, e.g., in a case where the TAB tapes wound on the reel is fed in the mounting process, two TAB tapes can adhere to each other, so that the two TAB tapes cannot be smoothly fed in the mounting process.

For prevention of the problem, the method and the packing structure of the present invention are preferably arranged such that after the TAB tape is stored at 50° C. for 24 hours, an adhesion between the solder resist and the insulating film is not higher than 2 N.

Further, the method and the packing structure of the present invention are preferably arranged such that the reel has a diameter from 70 mm to 105 mm.

Advantageous Effects of Invention

As described above, the method of the present invention for packing a TAB tape includes a first step of winding at least a TAB tape on an outer peripheral surface of a reel having a cylindrical shape, the reel having a shaft hole on its inner peripheral side, the TAB tape being a tape-shaped insulating film on which circuits are provided in a repeated manner, the circuits each of which is made up of metal wiring and a solder resist.

Further, the packing structure of the present invention for a TAB tape includes: a reel having a cylindrical shape, and having a shaft hole on its inner peripheral side; and at least a TAB tape wound on an outer peripheral surface of the reel, the TAB tape being a tape-shaped insulating film on which circuits are provided in a repeated manner, the circuits each of which is made up of metal wiring and a solder resist.

Therefore, the TAB tape and, if necessary, a spacer tape etc. are wound on the outer peripheral surface of the cylindrical reel. Thus, a packing size according to the method of the present invention for packing a TAB tape or according to the packing structure of the present invention for a TAB tape is smaller than a packing size in the case of a conventional reel with flanges, for the reason that no flange is used in the present invention.

BRIEF DESCRIPTION OF DRAWINGS

FIG. 1 is a perspective view illustrating one embodiment of a packing structure of the present invention for a TAB tape.

FIG. 2 is a perspective view illustrating one arrangement example of a core reel according to the packing structure for a TAB tape.

FIG. 3 is a view illustrating one arrangement example of the TAB tape according to the packing structure for a TAB tape. (a) of FIG. 3 is a top view, and (b) of FIG. 3 is an enlarged view of a cross-section taken along an I-I line in (a) of FIG. 3.

Figure 4:
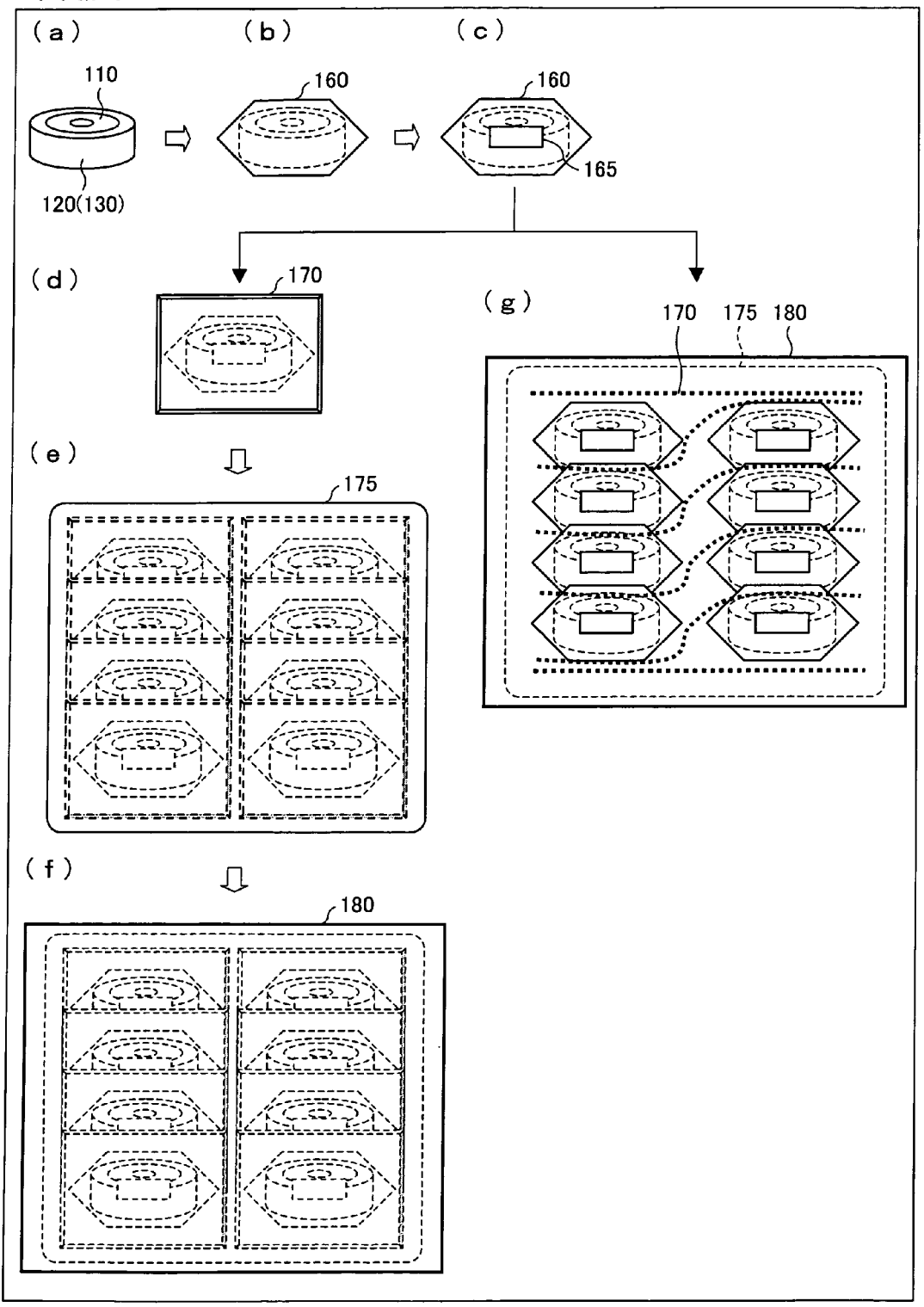
FIG. 4

(a) to (g) of FIG. 4 are views illustrating packing steps of the TAB tape.

FIG. 5

Figure 5:
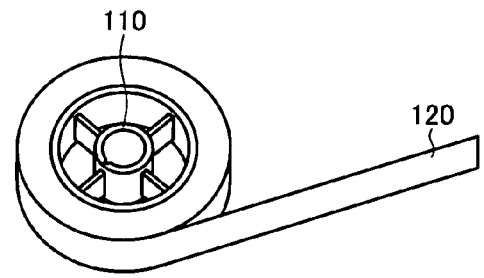

FIG. 5 is a perspective view illustrating another embodiment of the packing structure of the present invention for a TAB tape.

FIG. 6

Figure 6:
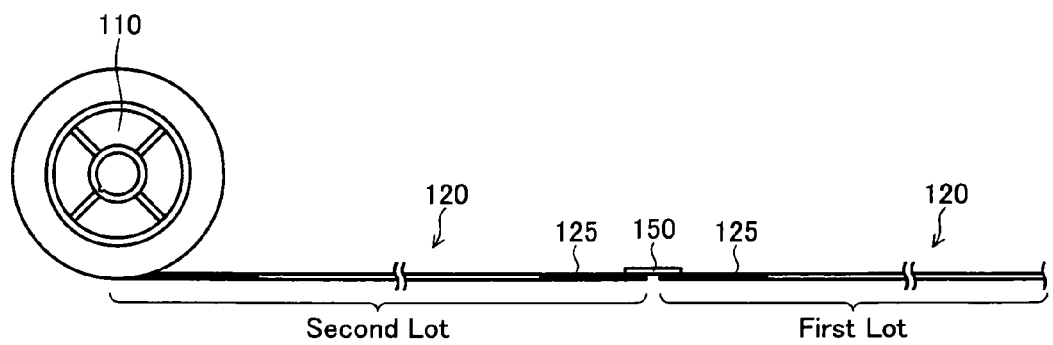

FIG. 6 is a view illustrating a case where a "1 core-multiple lot" arrangement is adopted in the packing structure for a TAB tape.

FIG. 7

FIG. 7 are tables showing, for the packing structure for a TAB tape, windable lengths of the TAB tapes and lengths corresponding to 1 (one) lot.

FIG. 8

Figure 8:
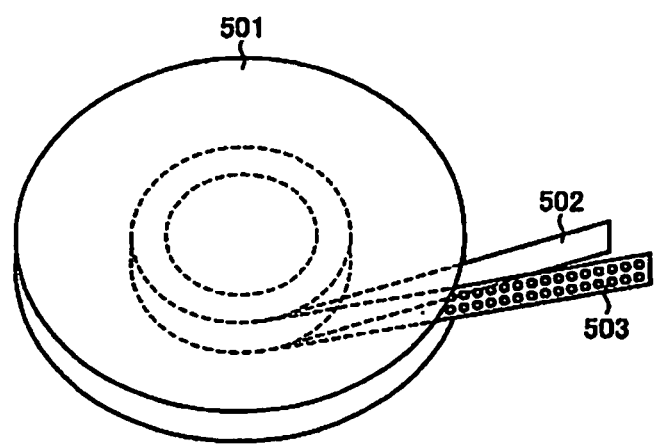

FIG. 8 is a perspective view illustrating an arrangement of a conventional packing structure for a TAB tape.

DESCRIPTION OF EMBODIMENTS

[First Embodiment]

The following describes one embodiment of the present invention, with reference to drawings.

Figure 1:
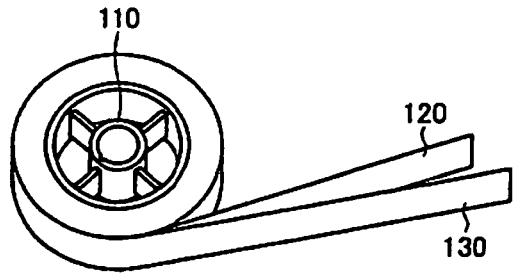
FIG. 1

FIG. 1 is a view illustrating a core reel 110 on which a TAB tape 120 and a flat spacer 130 are wound.

The present embodiment shows one example of a method for packing the TAB tape 120 and a packing structure for the TAB tape 120 which are for storing, shipping, and transporting the TAB tape 120 wound on a reel. The following describes respective arrangements of the core reel 110, the TAB tape 120, and the flat spacer 130 in this order. Then, the method for packing the TAB tape 120 is described.

(Arrangement of Core Reel)

Figure 2:
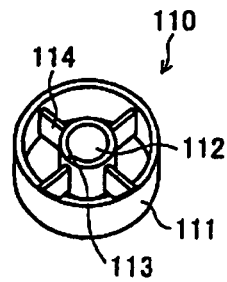
FIG. 2

FIG. 2 is a perspective view illustrating one arrangement example of the core reel 110.

The core reel 110 is a reel which does not have a flange, which is provided to a common reel, but has a core portion only. The core reel 110 is an insulator made from PS, specifically, from a resin made in such a manner that glass fibers are kneaded into PS. It is preferable that this increase a strength of a material for the core reel 110 so that the material has a high hardness (Rockwell hardness: M90 or higher) and a high viscosity (Melt flow rate (g/10 min): 7 or higher). This makes it possible to suppress dust generation.

Note that the core reel 110 preferably has electrical conductivity on its surface, as a countermeasure against adhesion of a foreign substance due to electrostatic charge. In this case, it is necessary to stabilize a resistance of a generated foreign substance in a range from $10^7 \Omega$ to $10^{10} \Omega$. Therefore, a resin having binding stability brought about by a polymeric material is kneaded into the material for the core reel 110 in forming of the core reel 110 so that a surface resistance of the core reel 110 is not higher than $10^{11} \Omega$, or preferably falls within a range from $10^6 \Omega$ to $10^{10} \Omega$. This makes it possible to prevent failures such as leakage which is caused by adhesion of a generated foreign substance to the TAB tape 120.

A specific example of the material for the core reel 110 is TOYOLAC parel manufactured by Toray Industries, Inc. TOYOLAC parel is an alloy material made from an ABS resin and an antistatic polymer. The glass fibers are kneaded into this.

The core reel 110 has a cylindrical outer shape. The TAB tape 120 and the flat spacer 130 are wound on an outer peripheral surface 111 of the core reel 110. A width of the outer peripheral surface 111 is determined in accordance with a width of the TAB tape 120. A diameter of the core reel 110 falls within a range from 70 mm to 105 mm. A core portion of the conventional reel 501 having flanges has a diameter from 105 mm to 127 mm in a case where the reel 501 has an outer dimension of Ø405 mm. In contrast to the conventional reel 501, the core reel 110 is for winding in only a raw tape on which no chip is mounted. The core reel 110 is accordingly smaller than the conventional reel 501.

A too small diameter of the core reel 110 is not preferable because there is a risk that a wiring pattern on that part of the TAB tape 120 which is wound on the core reel 110 first can be damaged. On the other hand, a too large diameter of the core reel 110 is not preferable because a wound amount of the TAB tape 120 decreases so that productivity is deteriorated.

The core reel 110 has, on a central axis of its cylindrical shape, a shaft hole 112 through which a shaft is inserted or removed. In general, a 1-inch shaft is adopted as the shaft. Therefore, the shaft hole 112 has such a diameter that the 1-inch shaft fits in the shaft hole 112. The shaft can have various shapes. Therefore, the diameter of the shaft hole 112 can be determined not only in accordance with a shape of the 1-inch shaft, but also in accordance with a shape of a shaft adopted in a user environment. The shaft has one positioning rib on its outer peripheral surface. The shaft hole 112 has a key groove 113 into which the positioning rib is inserted.

Further, in the core reel 110, a plurality of ribs 114 are provided so as to support a portion having the shaft hole 112. The plurality of ribs 114 are provided so as to form a cross as viewed from an axial direction of the core reel 110. As a result, the core reel 110 has a skeletal structure (hollow structure). A structure of the core reel 110 is not limited to this. That is, a shape (structure) of the core reel 110 is not limited to that illustrated in FIG. 2, provided that the shape (structure) of the core reel 110 has such a strength that the portion having the shaft hole 112 can be supported while the shaft is rotated in the shaft hole 112. For example, a sealed shape can be adopted. Other than this, an inner shape of the core reel 110 is not particularly limited, provided that the inner shape has a good moldability.

The core reel 110 thus arranged is made in such a manner that a resin chip is prepared first which is a material for the core reel 110, and then, the resin chip is putted in a mold and melted so as to be molded into a single piece. Alternatively, the resin chip can be molded by double-port molding in which the resin is supplied into the mold from two ports so as to be molded. This makes it possible to improve productivity. In this process, two different liquids can be adopted so that a resin such as polyacetal (POM), which is unlikely to generate dust, is adopted as a material for a shaft bearing (i.e., 1-inch shaft hole into which the shaft is fitted), which is likely to generate dust. POM is a material which has a low coefficient of friction, excels in abrasion resistance and moldability, and less generates dust.

The core reel 110 has no flange. Accordingly, the core reel 110 is smaller than a conventional reel having flanges. This makes it possible to reduce a used amount of the resin, without controlling a shape of a flange. This makes it possible to reduce costs of the core reel 110. In addition, it becomes possible to reduce work burden in reuse of the core reel 110.

(Arrangement of TAB Tape)

Figure 3:
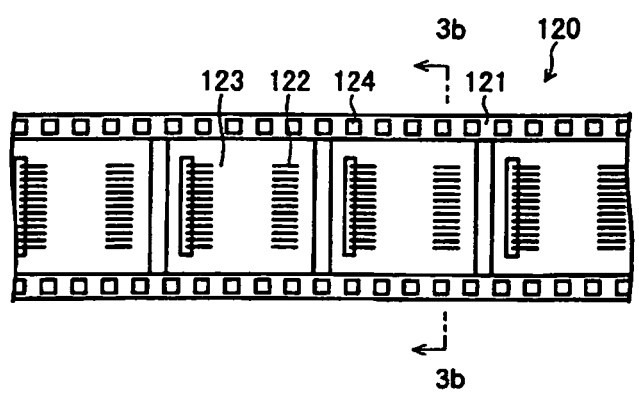
FIG. 3
Figure 3:
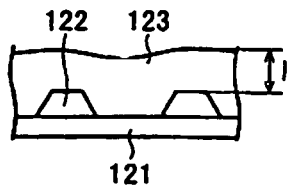

FIG. 3 is a view illustrating one arrangement example of the TAB tape 120. Specifically, (*a*) of FIG. 3 is a top view, and (*b*) of FIG. 3 is an enlarged view of a cross-section taken along an I-I line in (*a*) of FIG. 3.

The TAB tape 120 is arranged such that circuits formed by a common circuit manufacturing process are sequentially (repeatedly) provided, along a length direction of the TAB tape 120, on one side of a film 121 having a shape like a long tape. Areas on the TAB tape 120 where the circuits are provided are ultimately converted into semiconductor devices such as IC drivers.

The present embodiment assumes that in forming of the circuits, formation of wiring patterns 122 and a solder resist 123 has been completed which formation is carried out before chip parts are mounted on the TAB tape 120.

The film 121 is an insulating film made from an organic resin material such as polyimide. The film 121 has a thickness from, e.g., 25 μm to 100 μm, and a width from, e.g., 35 mm to 300 mm. The film 121 has holes 124 for transportation which are called sprocket holes. Specifically, the holes 124 are sequentially defined on both edge portions of the film 121 in a width direction of the film 121.

Each of the wiring patterns 122 is made up of leads which are electrically-conductive thin films made from copper. A surface of each of the leads is tin-plated (0.1 μmt to 0.5 μmt). Each of the leads has, at its end, an inner lead, an outer lead, a test pad, etc. The solder resist 123 having an electrical insulating property covers lines except outer leads which are used by a user as joints and inner leads to which semiconductor chips are connected.

Since the TAB tape 120 illustrated in FIG. 3 is a COF, the TAB tape 120 has no opening in areas on the film 121 where the semiconductor chips area mounted, nor a slit for folding the TAB tape 120. However, the TAB tape 120 is not limited to a COF, provided that that TAB tape 120 has a structure based on a TAB technique. For example, the TAB tape 120 can be, e.g., a TCP.

(Arrangement of Flat Spacer)

The flat spacer 130 is a film like a long tape. Both sides of the flat spacer 130 are flat. A material for the flat spacer 130 is preferably polyethylene terephthalate (PET), which can be stably molded. Alternatively, the material can be a resin such as polyethylene naphthalate, polyimide, polyetherimide, polysulfone, polyethylene, polypropylene, polyamide, and polyethersulfine.

The flat spacer 130 has a thickness from 50 μm to 125 μm. The width can be altered to various values in accordance with design of the flat spacer 130. However, it is preferable that the width be substantially equal to the width of the TAB tape 120. For example, the width of the flat spacer 130 is preferably 48 mm±0.5 mm in a case where the width of the TAB tape 120 is 48 mm.

(Method for Packing TAB Tape)

The following describes a flow in which the TAB tape 120 and the flat spacer 130 are wound on the core reel 110 so as to be packed for storage, shipping, and transportation.

First, the core reel 110 is attached to the shaft (not illustrated). Then, the TAB tape 120 and the flat spacer 130 which are stacked are wound several times on the outer peripheral surface 111 of the core reel 110. In winding, it is preferable that the flat spacer 130 be stacked on that side of the TAB tape 120 which is opposite to a side on which the circuits are provided, and the side of the TAB tape 120 on which the circuits are provided face inward (i.e., face the axis). Accordingly, the side of the TAB tape 120 on which the circuits are provided faces upward in a subsequent manufacturing step. This makes it possible to efficiently mount the chip parts on the TAB tape 120.

It is preferable that respective ends of the TAB tape 120 and the flat spacer 130 be not fastened to each other by use of a tape. If the respective ends of the TAB tape 120 and the flat spacer 130 are fastened to each other, there arises a problem in a subsequent manufacturing step.

Then, the shaft is rotated so as to rotate the core reel 110. Accordingly, the TAB tape 120 and the flat spacer 130 which are stacked are wound on the core reel 110. The core reel 110 has no flange. Therefore, in thus winding, it is necessary to hold the TAB tape 120 and the flat spacer 130 by use of a reinforcing plate, in order to prevent a displacement of the TAB tape 120 due to winding.

Since the core reel 110 has no flange, and the flat spacer 130 is adopted, a packing size (packing structure) of the TAB tape 120 and the flat spacer 130 which are thus wound on the core reel 110 can be accordingly smaller than a packing size (packing structure) of the TAB tape 502 and the embossed spacer 503 which are wound on that conventional reel 501 illustrated in FIG. 8 which has flanges.

The following describes subsequent packing steps, with reference to FIG. 4. FIG. 4 is a view illustrating packing steps of the TAB tape 120.

As illustrated in (*b*) of FIG. 4, the core reel 110, illustrated in (*a*) of FIG. 4, on which the TAB tape 120 has been wound is putted in an antistatic bag 160. Since the antistatic bag 160 is made from an aluminum laminate, the antistatic bag 160 allows both prevention of electrostatic charge and prevention of moisture. However, the present embodiment is not limited to this. As necessary, it is possible to adopt a moisture-proof bag made from an aluminum laminate, instead of the antistatic bag 160. In a case where it is necessary to check contents inside a packing bag, it is possible to adopt a transparent bag having a function of preventing electrostatic charge and a function of preventing moisture. In this case, a GX film manufactured by Toppan Printing Co., Ltd. can be suitably adopted as the transparent bag.

After the core reel 110 with the TAB tape 120 is thus putted in the antistatic bag 160, a vacuum is formed inside the antistatic bag 160, and then, nitrogen is sealed in the antistatic bag 160. Then, a mouth of the antistatic bag 160 is hermetically closed by thermocompression bonding. Such vacuum sealing makes it possible to fix the TAB tape 120 so that the TAB tape 120 is not displaced due to vibrations in transportation. The vacuum sealing also makes it possible to suppress oxidation of tin with which the surfaces of the wiring patterns 122 are plated. Sealing nitrogen in the antistatic bag 160 makes it possible to suppress the oxidation of tin more effectively.

In a case where silica gel is putted in the antistatic bag 160, excessive dryness causes a decrease in cumulative dimension of IL (inner leads). For this reason, it is necessary that a product be taken out from the antistatic bag 160, and then left standing for 24 hours, in order that ILB (Inner Lead Bonding) is carried out. Therefore, silica gel is not putted in the antistatic bag 160, in view of stabilization of the cumulative dimension of IL of the product and improvement of a working efficiency in ILB.

As illustrated in (c) of FIG. 4, then, a shipping label 165 showing information on the TAB tape 120 sealed in the antistatic bag 160 is affixed to the antistatic bag 160. The information that the shipping label 165 shows encompasses, e.g., a name of a product which is formed on the TAB tape 120, a quantity, a manufacturing date, etc.

As illustrated in (d) of FIG. 4, in order that the antistatic bag 160 is not damaged, the antistatic bag 160 in which the core reel 110 with the TAB tape 120 is sealed is then putted in an antistatic bubble bag 170 which is made, as a cushioning, from a bubble sheet (bubble wrap cushioning). This makes it possible to suppress damage of antistatic bags 160 which is caused by their mutual contact due to vibrations in transportation or the like and/or a drop impact. If the antistatic bag 160 is damaged, its function of preventing moisture is deteriorated severely.

As illustrated in (e) of FIG. 4, then, products thus packed are putted in a nylon bag 175. It is possible to put a plurality of products in the nylon bag 175 in accordance with a shipping size. In a case where products are not putted in the nylon bag 175, a foreign substance in a corrugated cardboard box in which the products are ultimately housed transfers to an antistatic bag 160. Then, the foreign substance is brought into a clean room as it is. This can cause contamination of the clean room, and/or transfer of the foreign substance to a product. Thus, putting the products in the nylon bag 175 makes it possible to reduce the foreign substance which is brought into the clean room.

Finally, as illustrated in (f) of FIG. 4, the products thus packed are putted in an outer case 180. The outer case 180 is made from corrugated cardboard or corrugated plastic. In a case where the width of each of TAB tapes 120 is 35 mm, TAB tapes 120 corresponding to 32 core reels 110 (4×8 rows) can be maximally housed in one outer case 180. In a case where the width of each of TAB tapes 120 is 48 mm, TAB tapes 120 corresponding to 20 core reels 110 (4×5 rows) can be maximally housed in one outer case 180.

The present embodiment is not limited to such a method that the antistatic bag 160 illustrated in (c) of FIG. 4 in which antistatic bag 160 the core reel 110 with the TAB tape 120 is sealed is putted in one bubble bag 170. Alternatively, as illustrated in (g) of FIG. 4, antistatic bags 160 can be putted in the nylon bag 175 so that a bubble bag 170 is inserted between two layers of antistatic bags 160. The products thus packed are also housed in the outer case 180, as is the case with (f) of FIG. 4.

Thus, the TAB tapes 120 packed in the outer case 180 are stored, shipped, and transported. In a case where an outer case which has a size for an outer size of each of the core reels 110 with the TAB tapes 120 is adopted as the outer case 180, reduction of the outer size of each of the core reels 110 with the TAB tapes 120 makes it possible to reduce a size of the outer case 180. This makes it possible to increase an efficiency of shipping and an efficiency of transportation. As a result, productivity is improved.

That is, the packing structure of the present embodiment for the TAB tape 120 takes only ⅕ of a storage space which has been conventionally required for the outer case 180. In other words, the packing structure of the present embodiment makes it possible to store approximately 5 times as many TAB tapes 120 as a conventional quantity in the storage space where TAB tapes 120 have been conventionally stored. This makes it possible to improve productivity per floor area. In addition, a workload of shipping operation can be reduced. Furthermore, shipping cost and transportation cost can be reduced to ⅕ of a conventional case.

[Second Embodiment]

The following describes another embodiment of the present invention, with reference to drawings. Arrangements other than those described in the present embodiment are the same as the First Embodiment. For convenience of explanation, members with the same functions as those of the members illustrated in the drawings of the First Embodiment are given the same reference numerals, and descriptions for the members are omitted.

The packing structure for the TAB tape 120 illustrated in FIG. 1, which has been described in the First Embodiment, makes it possible to reduce its packing size, as compared to the conventional packing structure for the TAB tape 502 illustrated in FIG. 8.

However, the flat spacer 130 is very likely to become charged because PET, which is an insulator, is adopted as the material for the flat spacer 130. In addition, the flat spacer 130 is wound on the core reel 110 in a lap-winding manner. Therefore, static electricity is likely to be generated. Due to these factors, the flat spacer 130 is likely to cause a foreign substance around the flat spacer 130 to adhere to the flat spacer 130. If a foreign substance is sandwiched between the TAB tape 120 and the flat spacer 130 in mounting of the chips, a dent on the TAB tape 120 and leakage in mounting the chips can be caused.

Usually, a used flat spacer 130 is discarded. However, according to the First Embodiment, the flat spacer 130 is reused for reduction of waste material. This requires a cost higher than a purchase cost of a new one. In the first place, adoption of the flat spacer 130 leads to a large shipping size. This results in a high transportation cost.

In view of this, the present embodiment describes below a packing method in which the flat spacer 130 is not used but only the TAB tape 120 is directly wound on the core reel 110.

FIG. 5 is a view illustrating a core reel 110 on which a TAB tape 120 is wound.

First, the core reel 110 is attached to a shaft. Then, the TAB tape 120 is wound several times on the outer peripheral surface 111 of the core reel 110. In winding, it is preferable that a side of the TAB tape 120 on which the circuits are provided face inward (i.e., face the axis).

Then, the shaft is rotated so as to rotate the core reel 110. Accordingly, the TAB tape 120 is wound on the core reel 110. The core reel 110 has no flange. Therefore, in thus winding, it is necessary to hold the TAB tape 120 by use of a reinforcing plate, in order to prevent a displacement of the TAB tape 120 due to winding.

On the other hand, it is necessary to apply a tension (winding tension) to the TAB tape 120 in its length direction in thus winding. In other words, the TAB tape 120 is stretched in the length direction while being wound on the core reel 110.

A small winding tension causes a loose winding of the TAB tape 120. If the core reel 110 is picked up at its shaft hole 112 in this case after the TAB tape 120 has been completely wound on the core reel 110, the TAB tape 120 is unfastened in a conic shape. Further, one core reel 110 is limited in its total winding length. Therefore, the core reel 110 does not allow winding for a plurality of lots.

In contrast, a large winding tension causes the solder resist 123 provided on the TAB tape 120 to serve as an adhesive material. Accordingly, the TAB tape 120 cannot be smoothly wound on the core reel 110. This gives a stress to the TAB tape 120. This can result in a failure such as a rip of the TAB tape 120. In addition, the holes 124 of the TAB tape 120, a defective punched hole, etc. transfer to the surface of the solder resist 123 and to the film 121. This causes their damages.

In view of this, it is preferable to control a winding tension in a range from 0.5 N to 2 N while winding the TAB tape 120. As a result of an experiment, the inventor of the present invention confirmed that in a case where the TAB tape 120 was wound on the core reel 110 at a winding tension in the range from 0.5 N to 2 N, a packing structure of the TAB tape 120 thus wound had no problem.

Since the TAB tape 120 is directly wound on the core reel 110 without use of the flat spacer 130, the packing structure of the TAB tape 120 thus wound can be accordingly smaller than the packing structure in which that flat spacer 130 of the First Embodiment which is illustrated in FIG. 1 is used.

Then, as illustrated in FIG. 4, the core reel 110 on which the TAB tape 120 is wound is putted in the antistatic bag 160, the bubble bag 170, the nylon bag 175, the outer case 180, etc. in this order. Thus, the TAB tape 120 is packed for storage, shipping, and transportation.

In a case where an outer case which has a size for an outer size of each of the core reels 110 with the TAB tapes 120 is adopted as the outer case 180, reduction of the outer size of each of the core reels 110 with the TAB tapes 120 makes it possible to further reduce a size of the outer case 180. This makes it possible to further increase an efficiency of shipping and an efficiency of transportation, and further improve productivity. As a result, a transportation cost can be further reduced.

Furthermore, the packing structure of the TAB tape 120 of the present embodiment uses no flat spacer 130. This makes it possible to reduce waste material largely. In addition, it becomes possible to reduce a cost of the flat spacer 130.

In a case where 40 m of the TAB tape 120 correspond to 1 (one) lot, e.g., thousands to tens of thousands of lots per month are supplied to a carrying lane in a manufacturing facility in a manufacturing process. Therefore, an arrangement in which 1 (one) lot is wound on one core reel 110 ("1 core-1 lot" arrangement) is low in work efficiency and in productivity because for every lot, it is necessary to replace a core reel 110 attached to the shaft with a new core reel 110 so as to feed the new core reel 110 to the carrying lane.

In contrast, the packing structure of the TAB tape 120 of the present embodiment is small because the TAB tape 120 is directly wound on the core reel 110. This makes it possible to adopt a "1 core-multiple lot" arrangement instead of the "1 core-1 lot" arrangement. This eliminates the need to feed a next lot to the carrying lane after 1 (one) lot is wound on a core reel 110. This makes it possible to improve a work efficiency and productivity. According to the "1 core-multiple lot" arrangement, further, a plurality of lots are sequentially fed to the manufacturing process. This increases an assembly workability. This allows cost reduction.

FIG. 6 is a view illustrating, for the "1 core-multiple lot" arrangement, the core reel 110 on which a TAB tape 120 is wound.

For a better workability in the manufacturing process, each of TAB tapes 120 actually has a leader tape in each of its anterior and posterior portions. The leader tape 125 is made up of two portions each of which has a length of 3 m. That is, the leader tape 125 has a total length of 6 m which is an industry standard.

In a case where a plurality of lots are wound on one core reel 110, two adjacent leader tapes 125 sandwiching a border between two adjacent lots are joined to each other. This joining is carried out as below. First, alignment is carried out by use of a splicer in such a manner that a pin is inserted into a hole 124 for carrying. Then, on each of both sides of the two adjacent leader tapes 125, a tape is attached so as to overlap respective surfaces of the two adjacent leader tapes 125.

However, this joining makes it very difficult to detach the tape in exchange of lots.

In view of this, according to the present embodiment, alignment is carried out in such a manner that a pin is inserted into a hole 124 for carrying, and then, as illustrated in FIG. 6, a tape 150 is attached so as to overlap respective surfaces of the two adjacent leader tapes 125, in the center therebetween, only on one side of the two adjacent leader tapes 125. This makes it possible to easily detach the tape 150. As a result, workability is improved. Thus, two adjacent lots are connected in such a manner that two adjacent leader tapes 125 are joined via a tape 150 only on the one side. This does not cause any problem in carrying.

Conventionally, receiving inspection has been carried out with respect to 1 (one) lot which corresponds to 40 m of a TAB tape. However, in a case where 4 lots (i.e., 40 m×4) are wound on one core reel, it is impossible to inspect all of the 4 lots. Accordingly, only a first one lot (oldest lot) is inspected. For this reason, it is preferable to wind the TAB tapes 120 on the core reel 110 so that a TAB tape 120 having a newest manufacturing date is wound first. This makes it possible to feed first a TAB tape 120 having an oldest manufacturing date to the carrying lane.

Therefore, in the case of the "1 core-multiple lot" arrangement, the shipping label 165 preferably shows an order in which the TAB tapes 120 are wound. The order shown on the shipping label 165 and an actual order in which the TAB tapes 120 are wound must be identical. Therefore, it is necessary to match the order shown on the shipping label 165 and the actual order.

The following are experimental results showing how long TAB tape(s) 120 the packing structure of the present embodiment for the TAB tape 120 makes it possible to wind on the core reel 110.

FIG. 7 are tables showing windable lengths of the TAB tapes 120 and lengths corresponding to 1 (one) lot.

As a result of the experiments, the packing structure of the present embodiment for the TAB tape 120 made it possible to wind 4 to maximally 6 lots in a case where 1 (one) lot corresponds to 40 m, as shown in Table 7. In other words, it was possible to wind a total length of 160 m (40 m×4 lots) to maximally 240 m of the TAB tapes 120. In order to wind more than 240 m, it is necessary to wind the TAB tapes more tightly (higher than 2 N). Therefore, it was impossible to carry out the present invention.

In consideration of a tolerance, a maximal total length of the TAB tapes 120 is 276 m (46 m×6 lots). A maximal total length of the TAB tapes 120, including a total length of the leader tapes 125, is 324 m which is found by the following equation: 276 m+48 m (4 m×2×6 lots)=324 m.

Although 1 (one) lot usually corresponds to 40 m, a length per lot can be changed to 80 m, 120 m, or 160 m, in accordance with a windable total length. This makes it possible to further improve productivity.

Usually, tape manufacturers adopt 120 m and 160 m as common manufacturing lengths. Manufacturing lengths which are multiples of 40 bring about a high productivity. For this reason, in a case where 1 (one) lot corresponds to 40 m, a tape manufacturer ships a set of 3 or 4 TAB tapes into which one TAB tape has been divided every 40 m. Therefore, in a case where 80 m, 120 m, or 160 m is adopted as a length per lot, a tape manufacturer can reduce a workload in bundling of products. As a result, the tape manufacturer can also achieve cost reduction.

According to the conventional packing structure, 40 m of a TAB tape is wound on one reel. Accordingly, an increase of a length of the TAB tape causes an increase of a size of the reel. This leads to a problem of an increased size of a packing structure. In contrast, the packing structure of the present embodiment makes it possible to wind a TAB tape having a length longer than 40 m, even if the packing size of the present embodiment is equal to a conventional packing size which has not been increased by an increase of a length of the TAB tape. Thus, the packing structure of the present embodiment allows an increase of a length of a TAB tape.

Furthermore, in a case where, e.g., 40 m of a TAB tape 120×4 lots (i.e., 160 m), or 80 m of a TAB tape 120×2 lots (i.e., 160 m) are wound on the core reel 110 having a diameter from 70 mm to 105 mm, the packing structure of the present embodiment makes it possible to reduce a transport volume per lot (40 m) to 1/20, as compared to the conventional packing structure. This makes it possible to largely decrease a transportation efficiency, and largely reduce a storage space for receiving materials.

Each of the TAB tapes 120 has a solder resist 123. The solder resist 123 originally has an adhesion property. A thicker solder resist 123 has a stronger adhesion. Accordingly, in a case where a TAB tape 120 is wound on the core reel 110 too tightly, two TAB tapes 120 can adhere to each other. In this case, the two TAB tapes 120 cannot be smoothly fed in the mounting process.

In view of this, as illustrated in (b) of FIG. 3, the solder resist 123 preferably has a thickness "1" of maximally 30 μm. A conventional solder resist also usually has a thickness of maximally 30 μm. Therefore, a conventional TAB tape can be adopted as it is.

As a result of experiments on thicknesses of the solder resist 123, no problem was caused in a case where the solder resist 123 had a thickness of not more than 30 μm. In a case where the solder resist 123 had a thickness of 35 μm, there was a problem for the reason that TAB tapes adhered too tightly to each other with a probability of 1/10 to 2/10. In a case where the solder resist 123 had a thickness of 40 μm, a carrying error occurred in a mounting process for the reason that TAB tapes adhered too tightly to each other with a probability of 80%.

The solder resist 123 has a property such that its adhesion is increased by a temperature increase. TAB tapes 120 housed in an outer case are stored, shipped, and transported usually at a temperature of 25° C. However, the TAB tapes 120 can be placed in a high-temperature environment in summer or other conditions.

Therefore, the solder resist 123 preferably has an adhesion of not higher than 2 N after being stored at 50° C. for 24 hours. This makes it possible to detach two TAB tapes by a force of not higher than 2 N, in, e.g., feeding of TAB tapes 120 wound on a core reel 110 in the mounting process. This eliminates an operational problem.

However, even if two TAB tapes adhere to each other, it is still possible to feed TAB tapes 120 in the mounting process. That is, an object is attached to a TAB tape 120 so as to apply a tension to the TAB tape 120, in order that the TAB tape 120 is pulled out from a core reel 110. This makes it possible to eliminate the problem of adhesion between two TAB tapes 120. For example, a weight of approximately 50 g to approximately 100 g is attached to the TAB tape 120 if there is the problem of adhesion between two TAB tapes 120.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

Industrial Applicability

The present invention is suitably applicable not only to fields related to that packing method of a TAB tape which is for storing, shipping, and transporting a TAB tape wound on a reel on which TAB tape no chip part has been mounted yet, but also to fields related to a packing structure of a TAB tape. Furthermore, the present invention is widely applicable to fields where a tape is used which is wound on a reel while being stored, shipped and transported.

REFERENCE SIGNS LIST

110 Core reel (reel)
111 Outer peripheral surface
112 Shaft hole
120 TAB tape
121 Film (insulating film)
122 Wiring pattern (metal wiring)
123 Solder resist
125 Leader tape
130 Flat spacer
150 Tape
160 Antistatic bag
165 Shipping label (label)
170 Bubble bag
175 Nylon bag
180 Outer case

The invention claimed is:

1. A method for packing a TAB tape in which method the TAB tape is wound on a reel so as to be packed, the TAB tape being a tape-shaped insulating film on which circuits are provided in a repeated manner, the circuits each of which is made up of metal wiring and a solder resist, the method comprising:
a first step of winding at least the TAB tape on an outermost peripheral surface of a reel having a cylindrical shape at a tension from 0.5 N to 2 N applied to the TAB tape, wherein
the reel comprises a shaft hole on its inner peripheral side,
the reel does not comprise a flange,
a diameter of the reel is greater than or equal to 70 mm and is less than or equal to 105 mm,
while the first step is performed, the TAB tape is held with a reinforcing plate to prevent displacement of the TAB tape being wound, and
while the first step is performed, the TAB tape is wound so that stacked portions of the TAB tape are in close contact with each other.

2. The method as set forth in claim 1, wherein the reel has a Rockwell hardness of not less than M90 and a melt flow rate of not less than 7 g/10 min.

3. The method as set forth in claim 1, wherein the reel has a surface resistance of not higher than $10^{11} \Omega$.

4. The method as set forth in claim 1, wherein:
one lot of the TAB tape has a predetermined length; and
a plurality of lots of TAB tapes are wound on the reel.

5. The method as set forth in claim 4, wherein a tape is attached to any two adjacent ones of the plurality of lots of the TAB tapes, on one side of the plurality of lots of the TAB tapes, so that any two adjacent ones of the plurality of lots of the TAB tapes are joined to each other.

6. A method as set forth in claim 1, further comprising a second step of vacuum-sealing, in an antistatic bag, the reel on which the TAB tape is wound.

7. The method as set forth in claim 6, wherein in the second step, nitrogen is sealed in the antistatic bag.

8. A method as set forth in claim 4, further comprising a second step of vacuum-sealing, in an antistatic bag, the reel on which the plurality of lots of the TAB tapes are wound.

9. The method as set forth in claim 8, wherein in the second step, nitrogen is sealed in the antistatic bag.

10. A method as set forth in claim 8, further comprising a third step of affixing, onto the antistatic bag, a label showing an order in which the plurality of lots of the TAB tapes are wound on the reel.

11. The method as set forth in claim 1, wherein after the TAB tape is stored at 50° C. for 24 hours, an adhesion between the solder resist and the insulating film is not higher than 2 N.

12. The method as set forth in claim 1, wherein the winding includes winding at least 160 m of the TAB tape on the reel.

13. A packing structure for a TAB tape, the TAB tape being wound on a reel of the packing structure so as to be packed, the TAB tape being a tape-shaped insulating film on which circuits are provided in a repeated manner, the circuits each of which is made up of metal wiring and a solder resist, the packing structure comprising:
  a reel having a cylindrical shape, and comprising a shaft hole on its inner peripheral side; and
    at least the TAB tape wound on an outermost peripheral surface of the reel at a tension from 0.5 N to 2 N applied to the TAB tape, wherein
  the reel does not comprise a flange,
  a diameter of the reel is greater than or equal to 70 mm and is less than or equal to 105 mm,
  the TAB tape is held with a reinforcing plate to prevent displacement of the TAB tape being wound, and
  the TAB tape is wound so that stacked portions of the TAB tape are in close contact with each other.

14. The packing structure as set forth in claim 13, wherein the reel has a Rockwell hardness of not less than M90 and a melt flow rate of not less than 7 g/10 min.

15. The packing structure as set forth in claim 13, wherein the reel has a surface resistance of not higher than $10^{11} \Omega$.

16. The packing structure as set forth in claim 13, wherein:
  one lot of the TAB tape has a predetermined length; and
  a plurality of lots of TAB tapes are wound on the reel.

17. The packing structure as set forth in claim 16, wherein a tape is attached to any two adjacent ones of the plurality of lots of the TAB tapes, on one side of the plurality of lots of the TAB tapes, so that any two adjacent ones of the plurality of lots of the TAB tapes are joined to each other.

18. The packing structure as set forth in claim 13, wherein the reel on which the TAB tape is wound is vacuum-sealed in an antistatic bag.

19. The packing structure as set forth in claim 18, wherein nitrogen is sealed in the antistatic bag in which the reel on which the TAB tape is wound is vacuum-sealed.

20. The packing structure as set forth in claim 16, wherein the reel on which the plurality of lots of the TAB tapes are wound is vacuum-sealed in an antistatic bag.

21. The packing structure as set forth in claim 20, wherein nitrogen is sealed in the antistatic bag in which the reel on which the plurality of lots of the TAB tapes are wound is vacuum-sealed.

22. The packing structure as set forth in claim 20, wherein a label showing an order in which the plurality of lots of the TAB tapes are wound on the reel is affixed onto the antistatic bag.

23. The packing structure as set forth in claim 13, wherein after the TAB tape is stored at 50° C. for 24 hours, an adhesion between the solder resist and the insulating film is not higher than 2 N.

24. The packing structure as set forth in claim 13, wherein at least 160 m of the TAB tape is wound on the reel.

* * * * *